United States Patent
Fairbairn et al.

(10) Patent No.: US 7,223,526 B2
(45) Date of Patent: *May 29, 2007

(54) METHOD OF DEPOSITING AN AMORPHOUS CARBON LAYER

(75) Inventors: Kevin Fairbairn, Los Gatos, CA (US); Michael Rice, Pleasanton, CA (US); Timothy Weidman, Sunnyvale, CA (US); Christopher S Ngai, Burlingame, CA (US); Ian Scot Latchford, Sunnyvale, CA (US); Christopher Dennis Bencher, Sunnyvale, CA (US); Yuxiang May Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 51 days.

This patent is subject to a terminal disclaimer.

(21) Appl. No.: 11/019,860

(22) Filed: Dec. 21, 2004

(65) Prior Publication Data

US 2005/0112509 A1 May 26, 2005

Related U.S. Application Data

(63) Continuation of application No. 10/322,228, filed on Dec. 17, 2002, now Pat. No. 6,841,341, which is a continuation of application No. 09/590,322, filed on Jun. 8, 2000, now Pat. No. 6,573,030.

(60) Provisional application No. 60/183,507, filed on Sep. 17, 2000.

(51) Int. Cl.
G03F 7/00 (2006.01)

(52) U.S. Cl. ............... 430/322; 430/311; 430/314; 430/315; 430/317; 430/324

(58) Field of Classification Search .............. 430/323, 430/311, 314, 315, 317, 322, 324
See application file for complete search history.

(56) References Cited

U.S. PATENT DOCUMENTS 4,486,286 A 12/1984 Lewin et al.

(Continued)

FOREIGN PATENT DOCUMENTS

DE 103 28 578 2/2004

(Continued)

OTHER PUBLICATIONS

Carter W. Kaanta, Susuan G. Bombardier, William J. Cote, William R. Hill, Gloria Kerszykowski, Howard S. Landis, Dan J. Poindexter, Curtis W. Pollard, Gilbert H. Ross, James G. Ryan, Stuart Wolff, John E. Cronin, "Dual Damascene: A Ulsi Wiring Technology," Jun. 11-12, 1991 VMIC Conference, pp. 144-152.

(Continued)

*Primary Examiner*—Amanda Walke
(74) *Attorney, Agent, or Firm*—Patterson and Sheridan

(57) ABSTRACT

A method of forming an integrated circuit using an amorphous carbon film. The amorphous carbon film is formed by thermally decomposing a gas mixture comprising a hydrocarbon compound and an inert gas. The amorphous carbon film is compatible with integrated circuit fabrication processes. In one integrated circuit fabrication process, the amorphous carbon film is used as a hardmask. In another integrated circuit fabrication process, the amorphous carbon film is an anti-reflective coating (ARC) for deep ultraviolet (DUV) lithography. In yet another integrated circuit fabrication process, a multi-layer amorphous carbon anti-reflective coating is used for DUV lithography.

20 Claims, 5 Drawing Sheets

U.S. PATENT DOCUMENTS

| | | |
|---|---|---|
| 4,532,150 A | 7/1985 | Endo et al. |
| 4,717,622 A | 1/1988 | Kurokawa et al. |
| 4,782,380 A | 11/1988 | Shankar et al. |
| 4,789,648 A | 12/1988 | Chow et al. |
| 4,957,591 A | 9/1990 | Sato et al. |
| 4,975,144 A | 12/1990 | Yamazaki et al. |
| 5,022,959 A | 6/1991 | Itoh et al. |
| 5,087,959 A | 2/1992 | Omori et al. |
| 5,121,706 A | 6/1992 | Nichols et al. |
| 5,221,414 A | 6/1993 | Langley et al. |
| 5,232,871 A | 8/1993 | Ho |
| 5,246,884 A | 9/1993 | Jaso et al. |
| 5,360,491 A | 11/1994 | Carey et al. |
| 5,397,558 A | 3/1995 | Miyanaga et al. |
| 5,461,003 A | 10/1995 | Havemann et al. |
| 5,470,661 A | 11/1995 | Bailey et al. |
| 5,549,935 A | 8/1996 | Nguyen et al. |
| 5,559,367 A | 9/1996 | Cohen et al. |
| 5,589,233 A | 12/1996 | Law et al. |
| 5,635,423 A | 6/1997 | Huang et al. |
| 5,674,355 A | 10/1997 | Cohen et al. |
| 5,674,573 A | 10/1997 | Mitani et al. |
| 5,679,267 A | 10/1997 | Belcher et al. |
| 5,679,269 A | 10/1997 | Cohen et al. |
| 5,691,010 A | 11/1997 | Kuramoto et al. |
| 5,710,067 A | 1/1998 | Foote et al. |
| 5,720,808 A | 2/1998 | Hirabayashi et al. |
| 5,744,865 A | 4/1998 | Jeng et al. |
| 5,750,316 A | 5/1998 | Kawamura et al. |
| 5,759,913 A | 6/1998 | Fulford, Jr. et al. |
| 5,773,199 A | 6/1998 | Linliu et al. |
| 5,780,874 A | 7/1998 | Kudo |
| 5,789,320 A | 8/1998 | Andricacos et al. |
| 5,795,648 A | 8/1998 | Goel et al. |
| 5,804,259 A | 9/1998 | Robles |
| 5,824,365 A | 10/1998 | Sandhu et al. |
| 5,830,332 A | 11/1998 | Babich et al. |
| 5,830,979 A | 11/1998 | Nakayama et al. |
| 5,837,331 A | 11/1998 | Menu et al. |
| 5,866,920 A | 2/1999 | Matsumoto et al. |
| 5,900,288 A | 5/1999 | Kuhman et al. |
| 5,930,655 A | 7/1999 | Cooney, III et al. |
| 5,930,669 A | 7/1999 | Uzoh |
| 5,942,328 A | 8/1999 | Grill et al. |
| 5,981,000 A | 11/1999 | Grill et al. |
| 5,989,623 A | 11/1999 | Chen et al. |
| 5,989,998 A | 11/1999 | Sugahara et al. |
| 5,998,100 A | 12/1999 | Azuma et al. |
| 6,007,732 A | 12/1999 | Hashimoto et al. |
| 6,020,458 A | 2/2000 | Lee et al. |
| 6,030,901 A | 2/2000 | Hopper et al. |
| 6,030,904 A | 2/2000 | Grill et al. |
| 6,033,979 A | 3/2000 | Endo |
| 6,035,803 A | 3/2000 | Robles et al. |
| 6,042,993 A | 3/2000 | Leuschner et al. |
| 6,043,167 A | 3/2000 | Lee et al. |
| 6,048,786 A | 4/2000 | Kudo |
| 6,057,226 A | 5/2000 | Wong |
| 6,057,227 A | 5/2000 | Harvey |
| 6,064,118 A | 5/2000 | Sasaki |
| 6,066,577 A | 5/2000 | Cooney, III et al. |
| 6,078,133 A | 6/2000 | Menu et al. |
| 6,080,529 A | 6/2000 | Ye et al. |
| 6,098,568 A | 8/2000 | Raoux et al. |
| 6,127,263 A | 10/2000 | Parikh |
| 6,140,224 A | 10/2000 | Lin |
| 6,140,226 A | 10/2000 | Grill et al. |
| 6,143,476 A | 11/2000 | Ye et al. |
| 6,147,407 A | 11/2000 | Jin et al. |
| 6,153,935 A | 11/2000 | Edelstein et al. |
| 6,165,890 A | 12/2000 | Kohl et al. |
| 6,183,930 B1 | 2/2001 | Ueda et al. |
| 6,184,572 B1 | 2/2001 | Mountsier et al. |
| 6,203,898 B1 | 3/2001 | Kohler et al. |
| 6,211,065 B1 | 4/2001 | Xi et al. |
| 6,214,637 B1 | 4/2001 | Kim et al. |
| 6,214,730 B1 | 4/2001 | Cooney, III et al. |
| 6,228,439 B1 | 5/2001 | Watanabe et al. |
| 6,235,629 B1 | 5/2001 | Takenaka |
| 6,265,779 B1 | 7/2001 | Grill et al. |
| 6,291,334 B1 | 9/2001 | Somekh |
| 6,316,167 B1 | 11/2001 | Angelopoulos et al. |
| 6,316,347 B1 | 11/2001 | Chang et al. |
| 6,323,119 B1 | 11/2001 | Xi et al. |
| 6,331,380 B1 | 12/2001 | Ye et al. |
| 6,333,255 B1 | 12/2001 | Sekiguchi |
| 6,346,747 B1 | 2/2002 | Grill et al. |
| 6,352,922 B1 | 3/2002 | Kim |
| 6,358,573 B1 | 3/2002 | Raoux et al. |
| 6,368,924 B1 | 4/2002 | Mancini et al. |
| 6,380,106 B1 | 4/2002 | Lim et al. |
| 6,413,852 B1 | 7/2002 | Grill et al. |
| 6,417,092 B1 | 7/2002 | Jain et al. |
| 6,423,384 B1 * | 7/2002 | Khazeni et al. ............. 427/577 |
| 6,428,894 B1 | 8/2002 | Babich et al. |
| 6,458,516 B1 | 10/2002 | Ye et al. |
| 6,479,821 B1 | 11/2002 | Hawryluk et al. |
| 6,495,390 B2 | 12/2002 | Hawryluk et al. |
| 6,498,070 B2 | 12/2002 | Chang et al. |
| 6,514,667 B2 | 2/2003 | Angelopoulos et al. |
| 6,514,857 B1 | 2/2003 | Naik et al. |
| 6,541,397 B1 * | 4/2003 | Bencher ..................... 438/780 |
| 6,548,417 B2 | 4/2003 | Dao et al. |
| 6,573,030 B1 | 6/2003 | Fairbairn et al. |
| 6,576,520 B2 | 6/2003 | Mancini et al. |
| 6,596,465 B1 | 7/2003 | Mangat et al. |
| 6,635,967 B2 | 10/2003 | Chang et al. |
| 6,653,735 B1 | 11/2003 | Yang et al. |
| 6,730,972 B2 | 5/2004 | Ravi et al. |
| 6,767,824 B2 | 7/2004 | Nallan et al. |
| 6,787,452 B2 * | 9/2004 | Sudijono et al. ............ 438/637 |
| 6,846,569 B2 | 1/2005 | Hu et al. |
| 6,852,647 B2 * | 2/2005 | Bencher ..................... 438/780 |
| 6,855,627 B1 | 2/2005 | Dakshina-Murthy et al. |
| 6,884,733 B1 | 4/2005 | Dakshina-Murthy et al. |
| 6,911,399 B2 * | 6/2005 | Liu et al. ..................... 438/725 |
| 6,913,868 B2 * | 7/2005 | Bencher et al. ............. 430/296 |
| 2001/0007788 A1 | 7/2001 | Chang et al. |
| 2002/0001778 A1 * | 1/2002 | Latchford et al. .......... 430/313 |
| 2002/0028392 A1 | 3/2002 | Jin et al. |
| 2002/0086547 A1 | 7/2002 | Mui et al. |
| 2002/0090794 A1 | 7/2002 | Chang et al. |
| 2003/0091938 A1 | 5/2003 | Fairbairn et al. |
| 2003/0186477 A1 * | 10/2003 | Bencher ..................... 438/30 |
| 2004/0023475 A1 | 2/2004 | Bonser et al. |
| 2004/0023502 A1 | 2/2004 | Tzou et al. |
| 2004/0038537 A1 | 2/2004 | Liu et al. |
| 2004/0092098 A1 * | 5/2004 | Sudijono et al. ............ 438/637 |
| 2004/0121604 A1 | 6/2004 | Neih et al. |
| 2004/0142281 A1 * | 7/2004 | Bencher et al. ............. 430/296 |
| 2004/0166691 A1 | 8/2004 | Nich et al. |
| 2004/0180551 A1 | 9/2004 | Biles et al. |
| 2004/0185674 A1 | 9/2004 | M'Saad et al. |
| 2004/0219304 A1 | 11/2004 | Neto et al. |
| 2004/0229470 A1 | 11/2004 | Rui et al. |
| 2005/0026338 A1 | 2/2005 | Reber et al. |
| 2005/0056835 A1 | 3/2005 | Yin et al. |
| 2005/0059262 A1 | 3/2005 | Yin et al. |
| 2005/0064719 A1 * | 3/2005 | Liu et al. ..................... 438/725 |
| 2005/0098105 A1 * | 5/2005 | Fuss et al. .................. 118/715 |

FOREIGN PATENT DOCUMENTS

| | | |
|---|---|---|
| EP | 0 224 013 | 6/1987 |

| | | |
|---|---|---|
| EP | 0 381 109 | 8/1990 |
| EP | 0 387 656 | 9/1990 |
| EP | 0 540 444 | 5/1993 |
| EP | 0 560 617 | 9/1993 |
| EP | 0 696 819 | 2/1996 |
| EP | 0 701 283 | 3/1996 |
| EP | 0 768 388 | 4/1997 |
| EP | 0 901 156 | 3/1999 |
| GB | 2299345 | 10/1996 |
| JP | 02-135736 | 5/1990 |
| JP | 11-026578 | 1/1997 |
| JP | 09-045633 | 2/1997 |
| WO | WO 99/33102 | 7/1999 |
| WO | WO 00/05763 | 2/2000 |

OTHER PUBLICATIONS

CRC Handbook of Chemistry and Physics, 79th Edition (1998-1999), pp. 12-49 and 12-55.
Endo, et al., "Preparation and Properties of Fluorinated Amorphous Carbon Thin Films by Plasma Enhanced Chemical Vapor Deposition", *Mat. Res. Symp. Proc.* vol. 381, Materials Research Society (1995), pp. 249-254.
European PCT International Search Report for PCT/US98/23888 Dated Mar. 3, 1999.
European Search Report for 01102401.5-1235, dated Jun. 9, 2004 (AMAT/4227.EP).
Grill et al., "Diamondlike Carbon Films by RF Plasma-Assisted Chemical Vapor Deposition From Acetylene", IBM Journal of Research and Development, 34(6), 1990, p. 849-857.
Grill, et al., "Diamondlike Carbon Materials as Low-k Dielectrics for Multilevel Interconnects in ULSI", *J. Electrochem. Soc.* 145 (5) (1998).
Howard Landis, Peter Burke, William Cote, William Hill, Cheryl Hoffman, Carter Kaanta, Charles Koburger, Walter Lange, Michael Leach and Stephen Luce, "Integration of chemical—mechanical polishing into CMOS integrated circuit manufacturing," Thin Solid Films, 220 (1992), pp. 1-7.
IBM Technical Disclosure Bulletin, Nov. 1993 "Damascene: Optimized Etch Stop Structure and Method", vol. 36; Issue 11, p. 649.
Matsubara, et al., "Low-k Fluorinated Amorphous Carbon Interlayer Technology for Quarter Micron Devices", *IEDM* (1996), pp. 369-372.

PCT International Preliminary Examination Report dated Feb. 15, 2000.
Rajiv V. Joshi, "A New Damascene Structure for Submicrometer Interconnect Wiring," Electron Device Letters, vol. 14, No. 3, Mar. 1993, pp. 129-132.
Robles, et al., "Characterization of High Density Plasma Chemical Vapor Deposited α-Carbon and α-Fluorinated Carbon Films For Ultra Low Dielectric Applications", *Int'l. Dielectrics for ULSI Multilevel Interconnection Conf.* (1997), 8 pages.
S. Lakshminarayanan, J. Steigerwald, D. T. Price, M. Bourgeois, T. P. Chow, "Contact and Via Structures with Copper Interconnects Fabricated Using Dual Damascene Technology," Electron Device Letters, vol. 15, No. 8 Aug. 1994, pp. 307-309.
T. Licata, M. Okazaki, M Ronay, W. Landers, T. Ohiwa, H. Poetzlberger, H. Aochi, D. Dobuzinsky, R. Filippi, D. Restaino, D. Knorr, J. Ryan, "Dual Damascene Al Wiring For 256M DRAM," Jun. 27-29, 1995 VMIC Conference, pp. 596-602.
Takeishi, et al., "Fluorocarbon Films deposited by PECVD with High thermal resistance and Low Dielectric Constants", *Semiconductor World* 16 (2) (1997), pp. 71-77.
Tue Nguyen, Bruce d. Ulrich, Lynn R. Allen and David R. Evans, "A Novel Damscene Process for One Mask Via/Interconnect Formation," 1996 Symposium on VLSI Technology Digest of Technical Papers, pp. 118-119.
PCT International Search Report for PCT/US05/005855 dated Oct. 13, 2005.
PCT Written Opinion for PCT/US05/005855 dated Oct. 13, 2005.
Liu, et al., "Generating Sub-30nm Poly-Silicon Gates Using PECVD Amorphous Carbon as Hardmask and Anti-Reflective Coating", Proceedings of the SPIE, Bellingham, VA, US, vol. 5040, No. 1, Feb. 25, 2003, pp. 841-848.
PCT Notification of Transmittal of the International Search Report dated May 31, 2005 for PCT/US05/008070.
PCT Written Opinion dated May 31, 2005 for PCT/US05/008070.
European Search Report for Application No. 01102401.5 dated Apr. 13, 2005.
Communication Pursuant to Article 96(2) EPC (Examination report), for 01102401.5-1235, dated Apr. 12, 2006.

* cited by examiner

METHOD OF DEPOSITING AN AMORPHOUS CARBON LAYER

CROSS-REFERENCE TO RELATED APPLICATIONS

This application is a continuation of U.S. patent application Ser. No. 10/322,228, filed on Dec. 17, 2002, now U.S. Pat. No. 6,841,341, issued Jan. 11, 2005, which application is a continuation of U.S. patent application Ser. No. 09/590,322 filed on Jun. 8, 2000, now U.S. Pat. No. 6,573,030, issued Jun. 3, 2003, which application claims benefit of U.S. Provisional Patent Application No. 60/183,507, filed on Feb. 17, 2000, which applications are incorporated by reference herein.

BACKGROUND OF THE DISCLOSURE

1. Field of the Invention

The present invention relates to an amorphous carbon film, its use in integrated circuit fabrication, and a method for depositing the film.

2. Description of the Background Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced (e.g., sub-micron dimensions), it has been necessary to use low resistivity conductive materials (e.g., copper) as well as low dielectric constant insulating materials (dielectric constant less than about 4.5) to improve the electrical performance of such components.

The demands for greater integrated circuit densities also impose demands on the process sequences used for integrated circuit manufacture. For example, in process sequences using conventional lithographic techniques, a layer of energy sensitive resist is formed over a stack of material layers on a substrate. An image of a pattern is introduced into the energy sensitive resist layer. Thereafter, the pattern introduced into the energy sensitive resist layer is transferred into one or more layers of the material stack formed on the substrate using the layer of energy sensitive resist as a mask. The pattern introduced into the energy sensitive resist can be transferred into one or more layers of the material stack using a chemical etchant. The chemical etchant is designed to have a greater etch selectivity for the material layers of the stack than for the energy sensitive resist. That is, the chemical etchant etches the one or more layers of the material stack at a much faster rate than it etches the energy sensitive resist. The faster etch rate for the one or more material layers of the stack typically prevents the energy sensitive resist material from being consumed prior to completion of the pattern transfer.

However, demands for greater circuit densities on integrated circuits have necessitated smaller pattern dimensions (e.g., sub-micron dimensions). As the pattern dimensions are reduced, the thickness of the energy sensitive resist must correspondingly be reduced in order to control pattern resolution. Such thinner resist layers (less than about 6000 Å) can be insufficient to mask underlying material layers during a pattern transfer step using a chemical etchant.

An intermediate oxide layer (e.g., silicon dioxide, silicon nitride), called a hardmask, is often used between the energy sensitive resist layer and the underlying material layers to facilitate pattern transfer into the underlying material layers. However, some material structures (e.g., damascene) include silicon dioxide and/or silicon nitride layers. Such material structures cannot be patterned using a silicon dioxide or silicon nitride hardmask as an etch mask.

Resist patterning problems are further compounded when lithographic imaging tools having deep ultraviolet (DUV) imaging wavelengths (e.g., less than about 250 nanometers (nm)) are used to generate the resist patterns. The DUV imaging wavelengths improve resist pattern resolution because diffraction effects are reduced at these shorter wavelengths. However, the increased reflective nature of many underlying materials (e.g., polysilicon and metal silicides) at such DUV wavelengths, can degrade the resulting resist patterns.

One technique proposed to minimize reflections from an underlying material layer uses an anti-reflective coating (ARC). The ARC is formed over the reflective material layer prior to resist patterning. The ARC suppresses the reflections off the underlying material layer during resist imaging, providing accurate pattern replication in the layer of energy sensitive resist.

A number of ARC materials have been suggested for use in combination with energy sensitive resists. For example, U.S. Pat. No. 5,626,967 issued May 6, 1997 to Pramanick et al. describes the use of titanium nitride anti-reflective coatings. However, titanium nitride is increasingly metallic as the exposure wavelength is reduced below 248 nm, meaning titanium nitride has high reflectivity for DUV radiation and is not an effective anti-reflective coating for DUV wavelengths.

U.S. Pat. No. 5,710,067 issued Jan. 20, 1998 to Foote et al. discloses the use of silicon oxynitride anti-reflective films. Silicon oxynitride films are difficult to remove, in that they leave residues behind that potentially interfere with subsequent integrated circuit fabrication steps.

Therefore, a need exists in the art for a material layer useful for integrated circuit fabrication, which has good etch selectivity with oxides. Particularly desirable would be a material layer that is also an ARC at DUV wavelengths and is easy to strip.

SUMMARY OF THE INVENTION

The present invention provides a method for forming an amorphous carbon layer for use in integrated circuit fabrication. The amorphous carbon layer is formed by thermally decomposing a gas mixture comprising a hydrocarbon compound and an inert gas. The gas mixture, which may optionally include an additive gas, is introduced into a process chamber where plasma enhanced thermal decomposition of the hydrocarbon compound in close proximity to a substrate surface, results in deposition of an amorphous carbon layer on the substrate surface.

An as-deposited amorphous carbon layer, deposited according to the process of the invention, has an adjustable carbon:hydrogen ratio that ranges from about 10% hydrogen to about 60% hydrogen. The amorphous carbon layer also has a light absorption coefficient, k, that can be varied between about 0.1 to about 1.0 at wavelengths below about 250 nm, making it suitable for use as an anti-reflective coating (ARC) at DUV wavelengths.

The amorphous carbon layer is compatible with integrated circuit fabrication processes. In one integrated circuit fabrication process, the amorphous carbon layer is used as a hardmask. For such an embodiment, a preferred process sequence includes depositing an amorphous carbon layer on a substrate. After the amorphous carbon layer is deposited on the substrate, an intermediate layer is formed thereon. A pattern is defined in the intermediate layer and transferred into the amorphous carbon layer. Thereafter, the pattern is transferred into the substrate using the amorphous carbon layer as a hardmask. Additionally, the pattern defined in the amorphous carbon hardmask can be incorporated into the structure of the integrated circuit, such as for example in a damascene structure.

In another integrated circuit fabrication process, the amorphous carbon layer is used as a single layer anti-reflective coating for DUV lithography. For such an embodiment, a preferred process sequence includes forming the amorphous carbon layer on a substrate. The amorphous carbon layer has a refractive index (n) in the range of about 1.5 to 1.9 and an absorption coefficient (k) in the range of about 0.1 to about 1.0 at wavelengths less than about 250 nm. The refractive index (n) and absorption coefficient (k) for the amorphous carbon ARC are tunable, in that they can be varied in the desired range as a function of the temperature and composition of the gas mixture during layer formation. After the amorphous carbon layer is formed on the substrate, a layer of energy sensitive resist material is formed thereon. A pattern is defined in the energy sensitive resist at a wavelength less than about 250 nm. Thereafter, the pattern defined in the energy sensitive resist is transferred into the amorphous carbon layer. After the amorphous carbon layer is patterned, such pattern is optionally transferred into the substrate.

In still another integrated circuit fabrication process, a multi-layer amorphous carbon anti-reflective coating is used for DUV lithography. For such an embodiment a preferred process sequence includes forming a first amorphous carbon layer on a substrate. The first amorphous carbon layer has an index of refraction in the range of about 1.5 to about 1.9 and an absorption coefficient (k) in the range of about 0.5 to about 1.0 at wavelengths less than about 250 nm. After the first amorphous carbon layer is formed on the substrate, a second amorphous carbon layer is formed thereon. The second amorphous carbon layer has an index of refraction of about 1.5 to about 1.9 and an absorption coefficient in the range of about 0.1 to about 0.5. The refractive index (n) and absorption coefficient (k) for the first and second amorphous carbon layers are tunable, in that they can be varied in the desired range as a function of the temperature and composition of the gas mixture during layer formation. A layer of energy sensitive resist material is formed on the second amorphous carbon layer. A pattern is defined in the energy sensitive resist layer at a wavelength less than about 250 nm. The pattern defined in the energy sensitive resist material is thereafter transferred into the second amorphous carbon layer followed by the first amorphous carbon layer. After the first amorphous carbon layer is patterned, such pattern is optionally transferred into the substrate.

BRIEF DESCRIPTION OF THE DRAWINGS

The teachings of the present invention can be readily understood by considering the following detailed description in conjunction with the accompanying drawings, in which.

DETAILED DESCRIPTION

The present invention provides a method of forming an integrated circuit using an amorphous carbon layer. The amorphous carbon layer is formed by thermally decomposing a gas mixture comprising a hydrocarbon compound and an inert gas. The gas mixture, which may optionally include an additive gas, is introduced into a process chamber where plasma enhanced thermal decomposition of the hydrocarbon compound in close proximity to a substrate surface, results in deposition of an amorphous carbon layer on the substrate surface. The amorphous carbon layer is compatible with integrated circuit fabrication processes, discussed below.

Figure 1A:
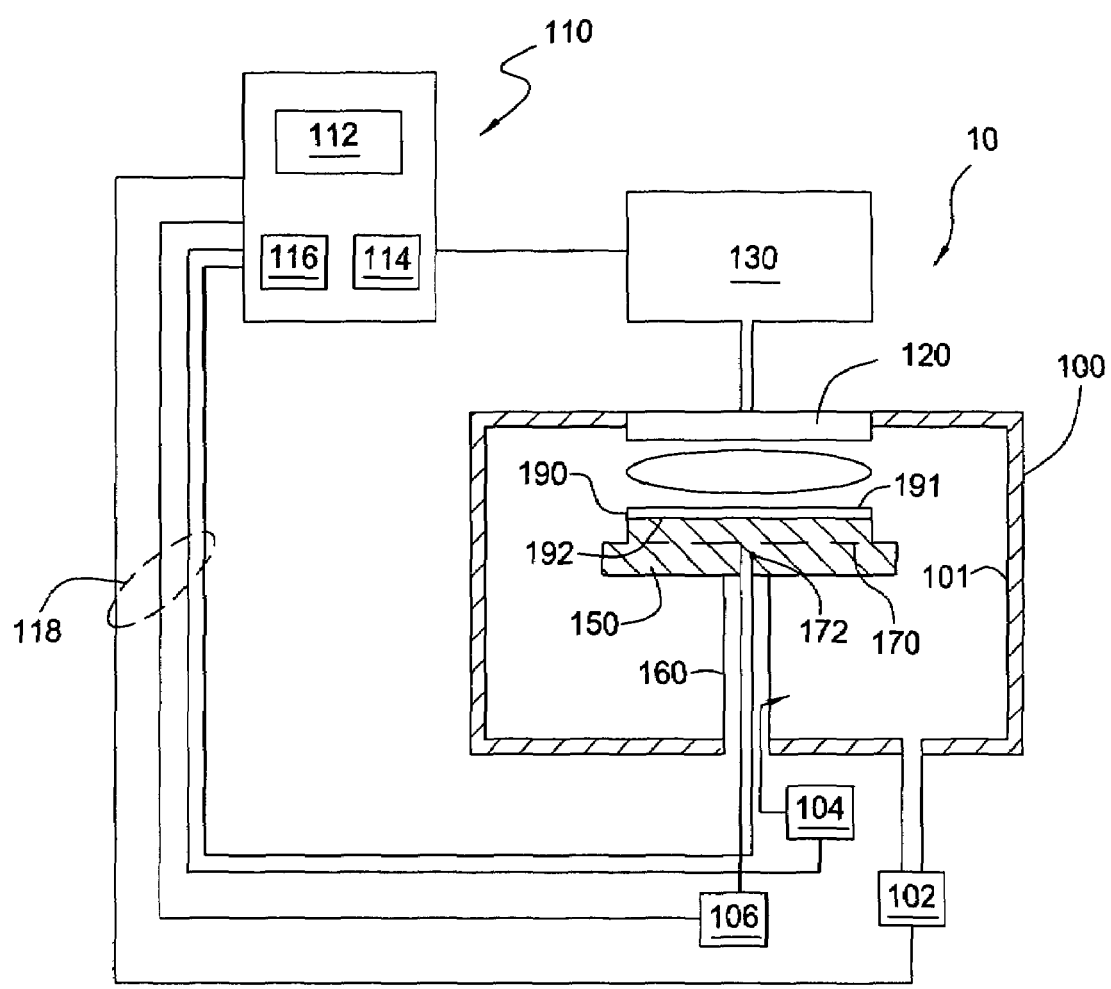
FIG. 1 depicts a schematic illustration of an apparatus that can be used for the practice of this invention.

FIG. 1 is a schematic representation of a wafer processing system 10 that can be used to perform amorphous carbon layer deposition in accordance with the present invention. This apparatus typically comprises a process chamber 100, a gas panel 130, a control unit 110, along with other hardware components such as power supplies and vacuum pumps. Details of the system 10 used in the present invention are described in a commonly assigned U.S. patent application, entitled "High Temperature Chemical Vapor Deposition Chamber", Ser. No. 09/211,998, filed on Dec. 14, 1998, and is herein incorporated by reference. The salient features of this system 10 are briefly described below. Examples of system 10 include CENTURA® systems, PRECISION 5000® systems and PRODUCER™ systems commercially available from Applied Materials Inc., Santa Clara, Calif.

The process chamber 100 generally comprises a support pedestal 150, which is used to support a substrate such as a semiconductor wafer 190. This pedestal 150 can typically be moved in a vertical direction inside the chamber 100 using a displacement mechanism (not shown). Depending on the specific process, the wafer 190 can be heated to some desired temperature prior to processing. In the present invention, the wafer support pedestal 150 is heated by an embedded heater element 170. For example, the pedestal 150 may be resistively heated by applying an electric current from an AC supply 106 to the heater element 170. The wafer 190 is, in turn, heated by the pedestal 150. A temperature sensor 172, such as a thermocouple, is also embedded in the wafer support pedestal 150 to monitor the temperature of the pedestal 150 in a conventional manner. The measured temperature is used in a feedback loop to control the power supply 16 for the heating element 170 such that the wafer temperature can be maintained or controlled at a desired temperature which is suitable for the particular process application. The pedestal 150 is optionally heated using a plasma or by radiant heat (not shown).

A vacuum pump 102, is used to evacuate the process chamber 100 and to maintain the proper gas flows and pressure inside the chamber 100. A showerhead 120, through which process gases are introduced into the chamber 100, is located above the wafer support pedestal 150. The showerhead 120 is connected to a gas panel 130, which controls and supplies various gases used in different steps of the process sequence.

The showerhead 120 and wafer support pedestal 150 also form a pair of spaced apart electrodes. When an electric field is generated between these electrodes, the process gases introduced into the chamber 100 are ignited into a plasma. Typically, the electric field is generated by connecting the wafer support pedestal 150 to a source of radio frequency (RF) power (not shown) through a matching network (not shown). Alternatively, the RF power source and matching network may be coupled to the showerhead 120, or coupled to both the showerhead 120 and the wafer support pedestal 150.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

In the present embodiment, amorphous carbon layer deposition is accomplished by plasma enhanced thermal decomposition of a hydrocarbon compound such as propylene ($C_3H_6$). Propylene is introduced into the process chamber 100 under the control of gas panel 130. The hydrocarbon compound is introduced into the process chamber as a gas with a regulated flow.

Proper control and regulation of the gas flows through the gas panel 130 is performed by mass flow controllers (not shown) and a controller unit 110 such as a computer. The showerhead 120 allows process gases from the gas panel 30 to be uniformly distributed and introduced into the process chamber 100. Illustratively, the control unit 110 comprises a central processing unit (CPU) 112, support circuitry 114, and memories containing associated control software 116. This control unit 110 is responsible for automated control of the numerous steps required for wafer processing—such as wafer transport, gas flow control, temperature control, chamber evacuation, and so on. Bi-directional communications between the control unit 110 and the various components of the apparatus 10 are handled through numerous signal cables collectively referred to as signal buses 118, some of which are illustrated in FIG. 1.

The heated pedestal 150 used in the present invention is made of aluminum, and comprises a heating element 170 embedded at a distance below the wafer support surface 151 of the pedestal 150. The heating element 170 can be made of a nickel-chromium wire encapsulated in an Incoloy sheath tube. By properly adjusting the current supplied to the heating element 170, the wafer 190 and the pedestal 150 can be maintained at a relatively constant temperature during film deposition. This is accomplished by a feedback control loop, in which the temperature of the pedestal 150 is continuously monitored by a thermocouple 172 embedded in the pedestal 150. This information is transmitted to the control unit 110 via a signal bus 118, which responds by sending the necessary signals to the heater power supply. Adjustment is subsequently made in the current supply 106 so as to maintain and control the pedestal 150 at a desirable temperature—i.e., a temperature that is appropriate for the specific process application. When the process gas mixture exits the showerhead 120, plasma enhanced thermal decomposition of the hydrocarbon compound occurs at the surface 191 of the heated wafer 190, resulting in a deposition of an amorphous carbon layer on the wafer 190.

Amorphous Carbon Layer Formation

In one embodiment of the invention the amorphous carbon layer is formed from a gas mixture of a hydrocarbon compound and an inert gas such as argon (Ar) or helium (He). The hydrocarbon compound has a general formula $C_xH_y$, where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$) as well as combinations thereof, may be used as the hydrocarbon compound. Similarly, a variety of gases such as hydrogen ($H_2$), nitrogen ($N_2$), ammonia ($NH_3$), or combinations thereof, among others, may be added to the gas mixture, if desired. Ar, He, and $N_2$ are used to control the density and deposition rate of the amorphous carbon layer. The addition of $H_2$ and/or $NH_3$ can be used to control the hydrogen ratio of the amorphous carbon layer, as discussed below.

In general, the following deposition process parameters can be used to form the amorphous carbon layer. The process parameters range from a wafer temperature of about 100° C. to about 500° C., a chamber pressure of about 1 torr to about 20 torr, a hydrocarbon gas ($C_xH_y$) flow rate of about 50 sccm to about 500 sccm (per 8 inch wafer), a RF power of between about 3 W/in$^2$ to about 20 W/in$^2$, and a plate spacing of between about 300 mils to about 600 mils. The above process parameters provide a typical deposition rate for the amorphous carbon layer in the range of about 100 Å/min to about 1000 Å/min and can be implemented on a 200 mm substrate in a deposition chamber available from Applied Materials, Inc.

Other deposition chambers are within the scope of the invention and the parameters listed above may vary according to the particular deposition chamber used to form the amorphous carbon layer. For example, other deposition chambers may have a larger or smaller volume, requiring gas flow rates that are larger or smaller than those recited for deposition chambers available from Applied Materials, Inc.

The as-deposited amorphous carbon layer has an adjustable carbon:hydrogen ratio that ranges from about 10% hydrogen to about 60% hydrogen. Controlling the hydrogen ratio of the amorphous carbon layer is desirable for tuning its optical properties as well as its etch selectivity. Specifically, as the hydrogen ratio decreases the optical properties of the as-deposited layer such as for example, the index of refraction (n) and the absorption coefficient (k) increase. Similarly, as the hydrogen ratio decreases the etch resistance of the amorphous carbon layer increases.

The light absorption coefficient, k, of the amorphous carbon layer can be varied between about 0.1 to about 1.0 at wavelengths below about 250 nm, making it suitable for use as an anti-reflective coating (ARC) at DUV wavelengths. The absorption coefficient of the amorphous carbon layer can be varied as a function of the deposition temperature. In particular, as the temperature increases the absorption coefficient of the as-deposited layer likewise increases. For example, when propylene is the hydrocarbon compound the k value for the as-deposited amorphous carbon layers can be increased from about 0.2 to about 0.7 by increasing the deposition temperature from about 150° C. to about 480° C.

The absorption coefficient of the amorphous carbon layer can also be varied as a function of the additive used in the gas mixture. In particular, the presence of $H_2$, $NH_3$, $N_2$ or combinations thereof, in the gas mixture can increase the k value by about 10% to about 100%.

Integrated Circuit Fabrication Processes

A. Amorphous Carbon Hardmask

Figure 2A:
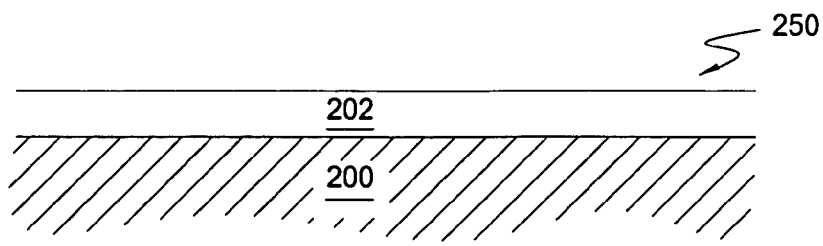
FIGS. 2a-2e depict schematic cross-sectional views of a substrate structure at different stages of integrated circuit fabrication incorporating an amorphous carbon layer as a hardmask.

FIGS. 2a-e illustrate schematic cross-sectional views of a substrate 200 at different stages of an integrated circuit fabrication sequence incorporating an amorphous carbon layer as a hardmask. In general, the substrate 200 refers to any workpiece on which processing is performed, and a substrate structure 250 is used to generally denote the substrate 200 together with other material layers formed on the substrate 200. Depending on the specific stage of processing, the substrate 200 may correspond to a silicon substrate, or other material layer that has been formed on the substrate. FIG. 2a, for example, illustrates a cross-sectional view of a substrate structure 250, having a material layer 202 that has been conventionally formed thereon. The material layer 202 may be an oxide (e.g., $SiO_2$). In general, the substrate 200 may include a layer of silicon, silicides, metals or other materials. FIG. 2a illustrates one embodiment in which the substrate 200 is silicon having a silicon dioxide layer formed thereon.

Figure 2B:
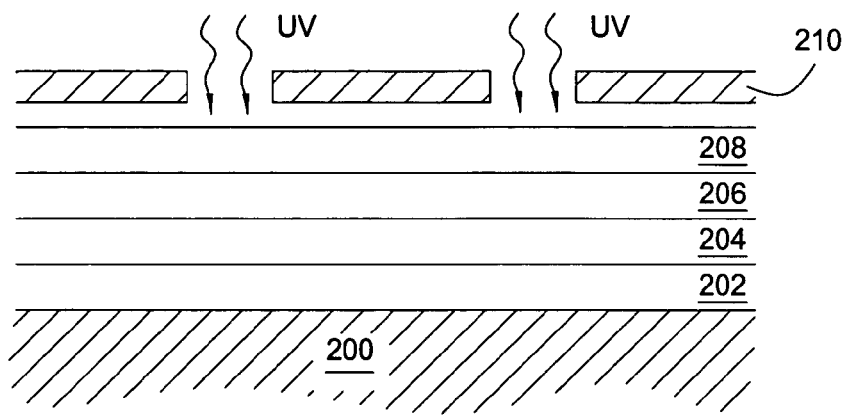

FIG. 2b depicts an amorphous carbon layer 204 deposited on the substrate structure 250 of FIG. 2a. The amorphous carbon layer 204 is formed on the substrate structure 250 according to the process parameters described above. The thickness of the amorphous carbon layer is variable depending on the specific stage of processing. Typically, the amorphous carbon layer has a thickness in the range of about 50 Å to about 1000 Å.

Dependant on the etch chemistry of the energy sensitive resist material used in the fabrication sequence, an intermediate layer 206 is formed on the amorphous carbon layer 204. The intermediate layer 206 functions as a mask for the amorphous carbon layer 204 when the pattern is transferred therein. The intermediate layer 206 is conventionally formed on the amorphous carbon layer 204. The intermediate layer 206 may be an oxide, nitride, silicon oxynitride, silicon carbide, amorphous silicon or other materials.

A layer of energy sensitive resist material 208 is formed on the intermediate layer 206. The layer of energy sensitive resist material 208 can be spin coated on the substrate to a thickness within the range of about 2000 Å to about 6000 Å. Most energy sensitive resist materials are sensitive to ultraviolet (UV) radiation having a wavelength less than about 450 nm. DUV resist materials are sensitive to UV radiation having wavelengths of 245 nm or 193 nm.

Figure 2C:
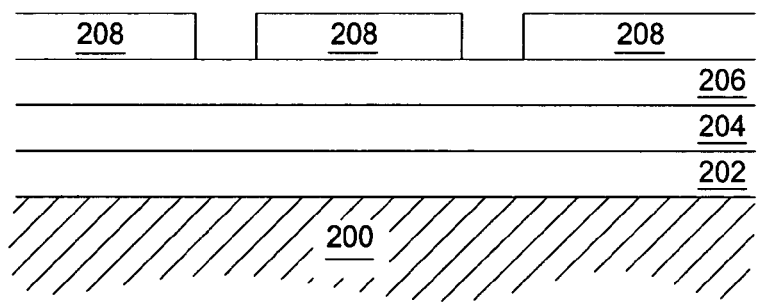
Figure 2D:
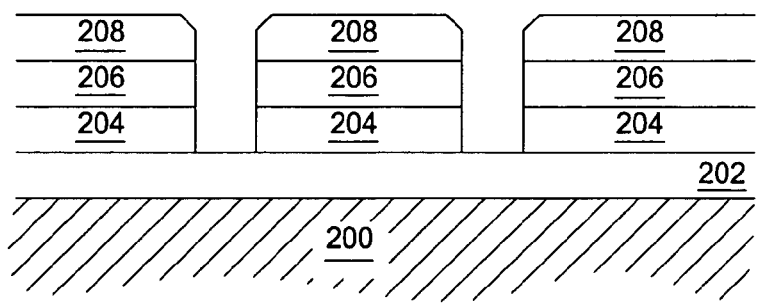

An image of a pattern is introduced into the layer of energy sensitive resist material 208 by exposing such energy sensitive resist material 208 to UV radiation via mask 210. The image of the pattern introduced in the layer of energy sensitive resist material 208, is developed in an appropriate developer to define the pattern through such layer as shown in FIG. 2c. Thereafter, referring to FIG. 2d, the pattern defined in the energy sensitive resist material 208 is transferred through both the intermediate layer 206 and the amorphous carbon layer 204. The pattern is transferred through the intermediate layer 206 using the energy sensitive resist material 208 as a mask. The pattern is transferred through the intermediate layer 206 by etching the intermediate layer 206 using an appropriate chemical etchant. The pattern is then transferred through the amorphous carbon layer 204 using the intermediate layer 206 as a mask. The pattern is transferred through the amorphous carbon layer 204 by etching the amorphous carbon layer 204 using an appropriate chemical etchant (e.g., ozone, oxygen or ammonia plasmas).

Figure 2E:
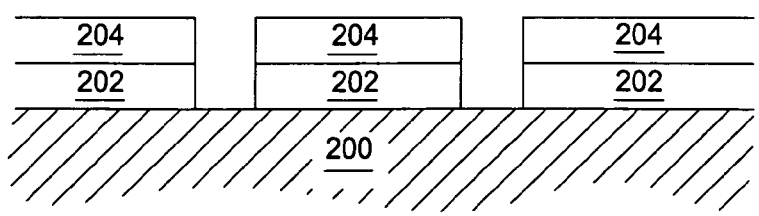

FIG. 2e illustrates the completion of the integrated circuit fabrication sequence by the transfer of the pattern defined in the amorphous carbon layer 204 through the silicon dioxide layer 202 using the amorphous carbon layer 204 as a hardmask.

After the silicon dioxide layer 202 is patterned, the amorphous carbon layer 204 can optionally be stripped from the substrate 200 by etching it in an ozone, oxygen or ammonia plasma.

In a specific example of a fabrication sequence, the pattern defined in the amorphous carbon hardmask can be incorporated into the structure of the integrated circuit, such as a damascene structure. Damascene structures are typically used to form metal interconnects on integrated circuits.

Figure 3A:
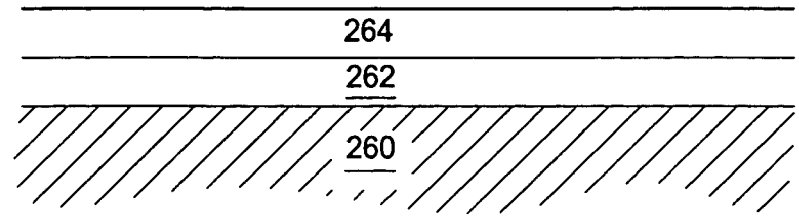
FIGS. 3a-3e depict schematic cross-sectional views of a damascene structure at different stages of integrated circuit fabrication incorporating an amorphous carbon layer as a hardmask.

FIGS. 3a-3e illustrate schematic cross-sectional views of a substrate 260 at different stages of a damascene structure fabrication sequence incorporating an amorphous carbon layer therein. Depending on the specific stage of processing, substrate 260 may correspond to a silicon substrate, or other material layer that has been formed on the substrate. FIG. 3a, for example, illustrates a cross-sectional view of a substrate 260 having a dielectric layer 262 formed thereon. The dielectric layer 262 may be an oxide (e.g., silicon dioxide, fluorosilicate glass). In general, the substrate 260 may include a layer of silicon, silicides, metals or other materials.

FIG. 3a illustrates one embodiment in which the substrate 260 is silicon having a fluorosilicate glass layer formed thereon. The dielectric layer 262 has a thickness of about 5,000 Å to about 10,000 Å, depending on the size of the structure to be fabricated. An amorphous carbon layer 264 is formed on the dielectric layer 262. The amorphous carbon layer is formed on the dielectric layer 262 according to the process parameters described above. The amorphous carbon layer 264 has a thickness of about 200 Å to about 1000 Å.

Figure 3B:
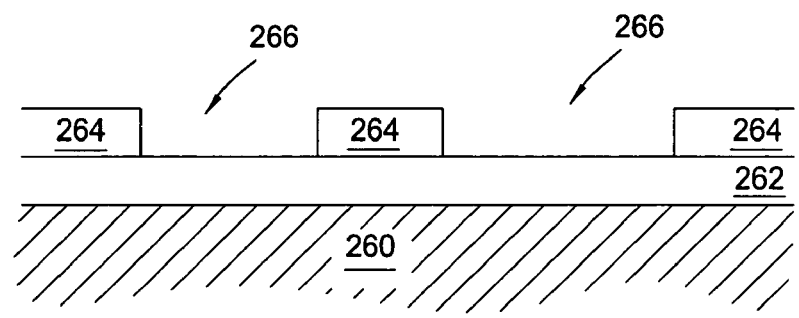

Referring to FIG. 3b, the amorphous carbon layer 264 is patterned and etched to define contact/via openings 266 and to expose the dielectric layer 262, in areas where the contacts/vias are to be formed. The amorphous carbon layer 264 is patterned using conventional lithography and etched using oxygen or ammonia plasmas.

Figure 3C:
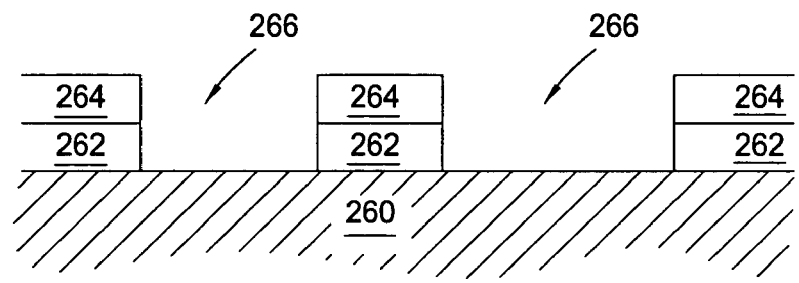
Figure 3D:
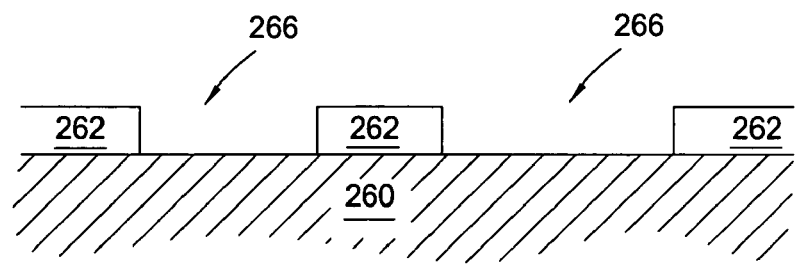

The contact/via openings 266 formed in the amorphous carbon layer 264 are than transferred into the dielectric layer 262 using the amorphous carbon layer 264 as a hard mask as shown in FIG. 3c. The contacts/vias 266 are etched using reactive ion etching or other anisotropic etching techniques. After the contacts/vias 266 are transferred into the dielectric layer 262, the amorphous carbon layer is stripped from dielectric layer 262 by etching it in an ozone, oxygen or ammonia plasma as depicted in FIG. 3d.

Figure 3E:
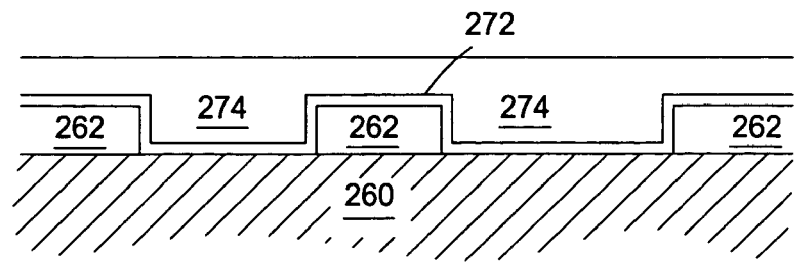

Referring to FIG. 3e, a metallization structure is formed in the contacts/vias 266 using a conductive material 274 such as aluminum, copper, tungsten, or combinations thereof. Typically, copper is used to form the metallization structure due to its low resistivity (about 1.7 $\mu\Omega$-cm). The conductive material 274 is deposited using chemical vapor deposition, physical vapor deposition, electroplating, or combinations thereof, to form the damascene structure. Preferably, a barrier layer 272 such as tantalum, tantalum nitride, or other suitable barrier is first deposited conformally in the metallization structure to prevent metal migration into the surrounding dielectric material layer 262. Additionally, the dielectric layer 262 preferably has a low dielectric constant (dielectric constants less than about 4.5)

so as to prevent capacitive coupling between adjacent contacts/vias 266 of the metallization structure.

B. Amorphous Carbon Anti-Reflective Coating (ARC)

Figure 4A:
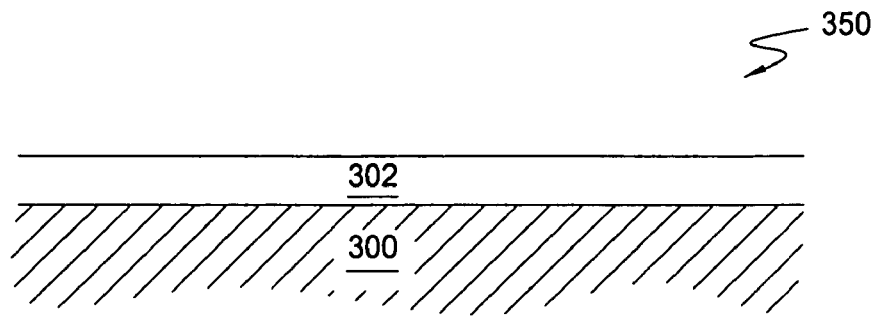
FIGS. 4a-4c depict schematic cross-sectional views of a substrate structure at different stages of integrated circuit fabrication incorporating an amorphous carbon layer as an anti-reflective coating (ARC)
Figure 4B:
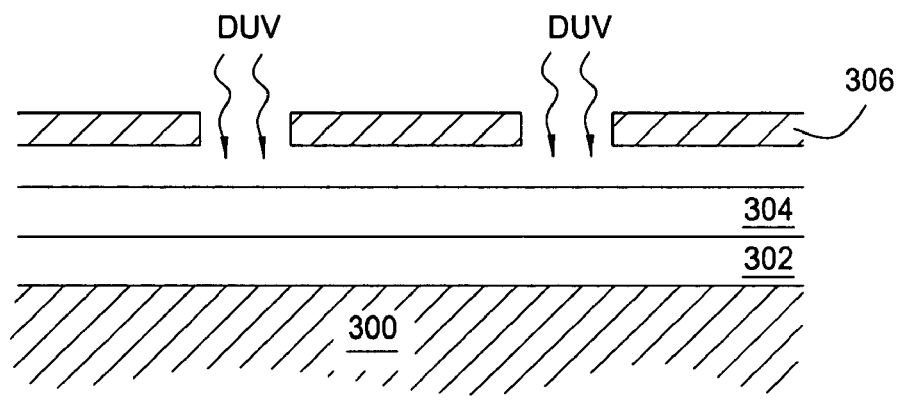
Figure 4C:
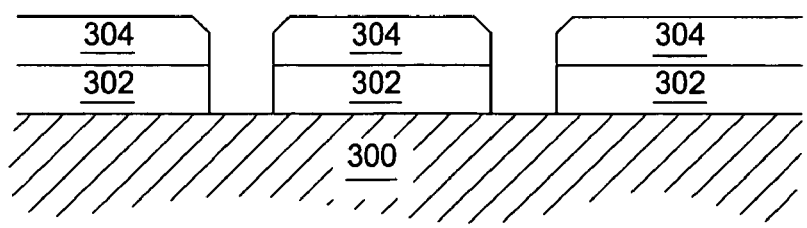

FIGS. 4a-4c illustrate schematic cross-sectional views of a substrate 300 at different stages of an integrated circuit fabrication sequence incorporating an amorphous carbon layer as an anti-reflective coating (ARC). In general, the substrate 300 refers to any workpiece on which film processing is performed, and a substrate structure 350 is used to generally denote the substrate 300 together with other material layers formed on the substrate 300. Depending on the specific stage of processing, substrate 300 may correspond to a silicon substrate, or other material layer, which has been formed on the substrate. FIG. 4a, for example, illustrates a cross-sectional view of a substrate structure 350 in which the substrate 300 is an oxide layer formed on a silicon wafer.

An amorphous carbon layer 302 is formed on the substrate 300. The amorphous carbon layer 302 is formed on the substrate 300 according to the process parameters described above. The amorphous carbon layer has a refractive index (n) in the range of about 1.5 to 1.9 and an absorption coefficient (k) in the range of about 0.1 to about 1.0 at wavelengths less than about 250 nm making it suitable for use as an ARC at DUV wavelengths. The refractive index (n) and absorption coefficient (k) for the amorphous carbon ARC are tunable, in that they can be varied in the desired range as a function of the temperature as well as the composition of the gas mixture during layer formation. The thickness of the amorphous carbon layer is variable depending on the specific stage of processing. Typically, the amorphous carbon layer has a thickness of about 200 Å to about 1100 Å.

FIG. 4b depicts a layer of energy sensitive resist material 304 formed on the substrate structure 350 of FIG. 4a.

FIG. 4a. The layer of energy sensitive resist material can be spin coated on the substrate to a thickness within the range of about 2000 Å to about 6000 Å. The energy sensitive resist material is sensitive to DUV radiation having a wavelength less than 250 nm.

An image of a pattern is introduced into the layer of energy sensitive resist material 304 by exposing such energy sensitive resist material 304 to DUV radiation via mask 306. The image of the pattern introduced into the layer of energy sensitive resist material 304 is developed in an appropriate developer to define the pattern through such layer. Thereafter, referring to FIG. 4c, the pattern defined in the energy sensitive resist material 304 is transferred through the amorphous carbon layer 302. The pattern is transferred through the amorphous carbon layer 302 using the energy sensitive resist material 304 as a mask. The pattern is transferred through the amorphous carbon layer 302 by etching it using an appropriate chemical etchant (e. g., ozone, oxygen or ammonia plasmas).

After the amorphous carbon 302 is patterned, such pattern is optionally transferred into the substrate 300. Typically, when substrate 300 comprises an oxide layer on a silicon substrate, the etch selectivity of the oxide to a resist mask is about 3:1 to about 5:1. Specifically, the oxide will etch about 3 to 5 times faster than the resist. In contrast, the amorphous carbon ARC layer of the present invention has an etch selectivity to the oxide of greater than about 10:1. That is, the oxide will etch more than 10 times faster than the amorphous carbon ARC. Thus, the amorphous carbon ARC layer also provides greater etch selectivity as a hardmask for patterning the oxide, without the added complexity of requiring an additional intermediate hardmask layer.

In an alternate embodiment, the amorphous carbon layer can have an absorption coefficient (k) that varies across the thickness of the layer. That is, the amorphous carbon layer can have an absorption coefficient gradient formed therein. Such a gradient is formed as a function of the temperature and the composition of the gas mixture during layer formation.

At any interface between two material layers, reflections can occur because of differences in their refractive indices (n) and absorption coefficients (k). When the amorphous carbon ARC has a gradient, it is possible to match the refractive indices (n) and the absorption coefficients (k) of the two material layers so there is minimal reflection and maximum transmission into the amorphous carbon ARC. Then the refractive index (n) and absorption coefficient (k) of the amorphous carbon ARC can be gradually adjusted to absorb all of the light transmitted therein.

C. Multi-Layer Amorphous Carbon Anti-Reflective Coating (ARC)

Figure 5A:
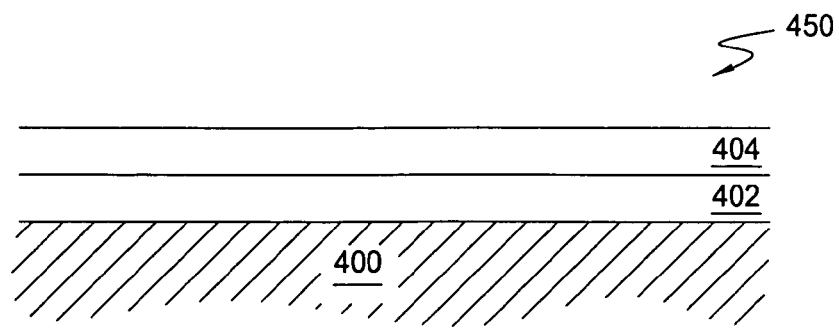
FIGS. 5a-5d depict schematic cross-sectional views of a substrate structure at different stages of integrated circuit fabrication incorporating a multi-layer amorphous carbon ARC structure.

FIGS. 5a-5d illustrate schematic cross-sectional views of a substrate 400 at different stages of an integrated circuit fabrication sequence incorporating a multi-layer amorphous carbon anti-reflective coating (ARC) structure. In general, the substrate 400 refers to any workpiece on which film processing is performed, and a substrate structure 450 is used to generally denote the substrate 400 together with other material layers formed on the substrate 400. Depending on the specific stage of processing, substrate 400 may correspond to a silicon substrate, or other material layer, which has been formed on the substrate. FIG. 5a, for example, illustrates a cross-sectional view of a substrate structure 450 in which the substrate 400 is a silicon wafer.

A first amorphous carbon layer 402 is formed on the substrate 400. The first amorphous carbon layer 402 is formed on the substrate 400 according to the process parameters described above. The first amorphous carbon layer 402 is designed primarily for light absorption. As such, the first amorphous carbon layer 402 has an index of refraction in the range of about 1.5 to about 1.9 and an absorption coefficient (k) in the range of about 0.5 to about 1.0 at wavelengths less than about 250 nm. The thickness of the first amorphous carbon layer 402 is variable depending on the specific stage of processing. Typically, the first amorphous carbon layer 402 has a thickness in the range of about 300 Å to about 1500 Å.

A second amorphous carbon layer 404 is formed on the first amorphous carbon layer 402. The second amorphous carbon layer 404 is also formed according to the process parameters described above. The second amorphous carbon layer 404 is designed primarily for phase shift cancellation. Specifically, the second amorphous carbon layer is designed to create reflections that cancel those generated at the interface with an overlying material layer (e.g., an energy sensitive resist material). As such, the second amorphous carbon layer 404 has an index of refraction of about 1.5 to about 1.9 and an absorption coefficient in the range of about 0.1 to about 0.5.

The thickness of the second amorphous carbon layer 404 is also variable depending on the specific stage of processing. Typically, the second amorphous carbon layer 404 has a thickness in the range of about 300 Å to about 700 Å. The refractive index (n) and the absorption coefficient (k) of the first and second amorphous carbon layers are tunable, in that they can be varied as a function of the temperature as well as the composition of the gas mixture during layer formation.

Additional amorphous carbon layers may be included in the multi-layered amorphous carbon ARC structure. For example, more than one top layer can be used to cancel reflections generated at the interface with for example, the energy sensitive resist material, while more than one bottom layer can be used to absorb light transmitted therein minimizing reflections at the interface of the multi-layered amorphous carbon ARC structure with underlying materials such as for example low dielectric constant oxides.

Figure 5B:
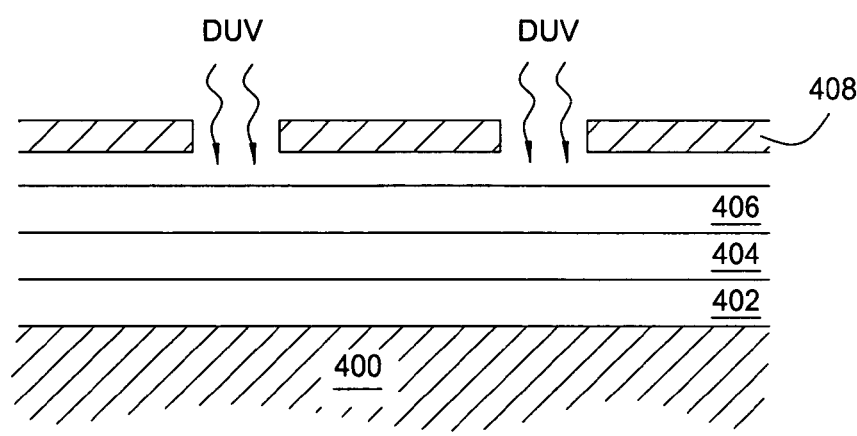

FIG. 5b depicts a layer of energy sensitive resist material 406 formed on the substrate structure 450 of FIG. 5a. The layer of energy sensitive resist material can be spin coated on the substrate to a thickness within the range of about 2000 Å to about 6000 Å. The energy sensitive resist material is sensitive to DUV radiation having a wavelength less than 250 nm.

An image of a pattern is introduced into the layer of energy sensitive resist material 406 by exposing such energy sensitive resist material 406 to DUV radiation via mask 408.

Figure 5C:
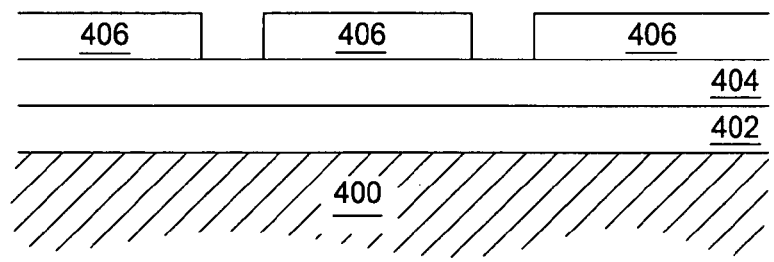
Figure 5D:
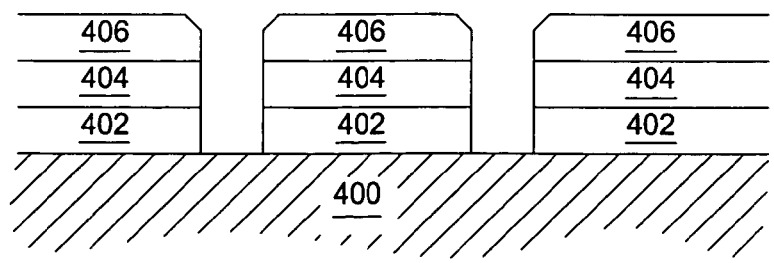

The image of the pattern introduced into the layer of energy sensitive resist material 406 is developed in an appropriate developer to define the pattern through such layer as shown in FIG. 5c. Thereafter, referring to FIG. 5d, the pattern defined in the energy sensitive resist material 406 is transferred through both amorphous carbon layers 404, 402 using the energy sensitive resist material 406 as a mask. The pattern is transferred through the amorphous carbon layers 404, 402 by etching them using an appropriate chemical etchant (e.g., ozone, oxygen or ammonia plasmas). After the multi-layer ARC is patterned, such pattern is optionally transferred into the substrate.

The multi-layered amorphous carbon ARC structure described with reference to FIGS. 5a-5d, also provides etch selectivity as a hardmask for patterning such underlying material layers as low dielectric constant oxides, without the added complexity of requiring an additional intermediate hardmask layer, as discussed previously for the single-layer amorphous carbon ARC.

Although several preferred embodiments which incorporate the teachings of the present invention have been shown and described in detail, those skilled in the art can readily devise many other varied embodiments that still incorporate these teachings.

What is claimed is:

1. A method of forming an amorphous carbon layer on a substrate comprising:
   positioning a substrate in a deposition chamber;
   providing a gas mixture to the deposition chamber, wherein the gas mixture comprises an inert gas and one or more hydrocarbon compounds having the general formula $C_xH_y$, wherein x has a range of 2 to 4 and y has a range of 2 to 10;
   maintaining the deposition chamber at a pressure between about 1 Torr to about 20 Torr;
   applying a RF power between about 3 W/in$^2$ to about 20 W/in$^2$ to generate a plasma; and
   depositing the amorphous carbon layer from the gas mixture.

2. The method of claim 1, wherein the one or more hydrocarbon compounds are selected from the group consisting of propylene ($C_3H_6$), propyne ($C_3H_4$), propane ($C_3H_8$), butane ($C_4H_{10}$), butylene ($C_4H_8$), butadiene ($C_4H_6$), acetylene ($C_2H_2$), and combinations thereof.

3. The method of claim 1, wherein the one or more hydrocarbon compounds comprise propylene ($C_3H_6$), acetylene ($C_2H_2$), or combinations thereof.

4. The method of claim 3, wherein the inert gas is selected from the group consisting of helium, argon, and combinations thereof.

5. The method of claim 4, wherein the gas mixture further comprises an additive gas selected from the group consisting of ammonia, nitrogen, hydrogen, and combinations thereof.

6. The method of claim 1, wherein the deposition temperature is from 150° C. to about 480° C.

7. A method of forming a device, comprising:
   forming one or more amorphous carbon layers on a substrate by providing a gas mixture to the deposition chamber, wherein the gas mixture comprises an inert gas, hydrogen gas, and one or more hydrocarbon compounds having the general formula $C_xH_y$, wherein x has a range of 2 to 4 and y has a range of 2 to 10, maintaining the deposition chamber at a pressure between about 1 Torr to about 20 Torr, and applying a RF power between about 3 W/in$^2$ to about 20 W/in$^2$ to generate a plasma to form the one or more amorphous carbon layers from the gas mixture on the substrate;
   defining a pattern in at least one region of the one or more amorphous carbon layers; and
   transferring the pattern defined in the at least one region of the one or more amorphous carbon layers into the substrate using the one or more amorphous carbon layers as a mask.

8. The method of claim 7, wherein the one or more hydrocarbon compounds are selected from the group consisting of propylene ($C_3H_6$), propyne ($C_3H_4$), propane ($C_3H_8$), butane ($C_4H_{10}$), butylene ($C_4H_8$), butadiene ($C_4H_6$), acetylene ($C_2H_2$), and combinations thereof.

9. The method of claim 8, wherein the one or more hydrocarbon compounds comprise propylene ($C_3H_6$), acetylene ($C_2H_2$), or combinations thereof.

10. The method of claim 7, wherein the inert gas is selected from the group consisting of helium, argon and combinations thereof.

11. The method of claim 7, wherein the deposition temperature is from 150° C. to about 480° C.

12. The method of claim 7, further comprising the step of removing the one or more amorphous carbon layers from the substrate.

13. The method of claim 12, wherein the one or more amorphous carbon layers are removed from the substrate using an ozone, oxygen, or NH$_3$ plasma.

14. The method of claim 7, wherein definition of the pattern in the at least one region of the one or more amorphous carbon layers, comprises:
   forming a layer of energy sensitive resist material adjacent the one or more amorphous carbon layers;
   introducing an image of the pattern into the layer of energy sensitive resist material by exposing the energy sensitive resist material to patterned radiation;
   developing the image of the pattern introduced into the layer of energy sensitive resist material; and
   transferring the pattern through the one or more amorphous carbon layers using the layer of energy sensitive resist material as a mask.

15. The method of claim 7, further comprising:
   forming an intermediate layer on the one or more amorphous carbon layers prior to forming the layer of energy sensitive resist thereon, introducing the image of a pattern therein, and developing the image of the pattern;

transferring the image of the pattern developed in the layer of energy sensitive resist material through the intermediate layer using the energy sensitive resist material as a mask; and transferring the pattern through the one or more amorphous carbon layers using the intermediate layer as a mask.

16. The method of claim 7, wherein the substrate has one or more material layers formed thereon.

17. The method of claim 15, wherein the intermediate layer comprises a material selected from the group consisting of silicon dioxide, silicon nitride, silicon oxynitride, silicon carbide, and amorphous silicon.

18. The method of claim 7, wherein the one or more amorphous carbon layers comprise two amorphous carbon layers each having an absorption coefficient in the range of about 0.1 to about 1.0 at wavelengths less than about 250 nm and wherein the one or more amorphous carbon layers each have an index of refraction in the range of about 1.5 to about 1.9.

19. The method of claim 7, wherein transferring the pattern formed in the amorphous carbon layer into the substrate comprises transferring the pattern through one or more dielectric layer to form contacts/vias therein and further comprising filling the contacts/vias formed in the dielectric layer with a conductive material.

20. A method of forming an amorphous carbon layer on a substrate comprising:

positioning a substrate in a deposition chamber;

providing a gas mixture to the deposition chamber, wherein the gas mixture comprises helium, hydrogen, and one or more hydrocarbon compounds selected from the group of propylene ($C_3H_6$), acetylene ($C_2H_2$), and combinations thereof;

maintaining the deposition chamber at a pressure between about 1 Torr to about 20 Torr;

maintaining a deposition temperature from 150° C. to about 480° C.;

applying a RF power between about 3 W/in$^2$ to about 20 W/in$^2$ to generate a plasma; and depositing the amorphous carbon layer from the gas mixture.

* * * * *

UNITED STATES PATENT AND TRADEMARK OFFICE
CERTIFICATE OF CORRECTION

| | |
|---|---|
| PATENT NO. | : 7,223,526 B2 |
| APPLICATION NO. | : 11/019860 |
| DATED | : May 29, 2007 |
| INVENTOR(S) | : Fairbairn et al. |

Page 1 of 1

It is certified that error appears in the above-identified patent and that said Letters Patent is hereby corrected as shown below:

In the Specification:

In Column 7, Lines 57-58, please delete the spaces between "to" and "FIG. $2d$" and insert a single space;

In Column 8, Line 46, please delete "than" and insert --then--;

In Column 11, Lines 11-12, please delete the spaces between "of" and "FIG. $5a$." and insert a single space;

In Column 11, Lines 23-24, please delete the spaces between "to" and FIG. $5d$," and insert a single space.

In the Claims:

In Column 11, Claim 2, Line 63, please delete "($C4H_8$)," and insert --$(C_4H_8)$,--;

In Column 12, Claim 7, Line 14, please delete "$C_xH_y$" and insert --$C_xH_y$,--.

Signed and Sealed this

Seventh Day of August, 2007

JON W. DUDAS
*Director of the United States Patent and Trademark Office*